(12) United States Patent
Kim et al.

(10) Patent No.: US 7,242,142 B2
(45) Date of Patent: Jul. 10, 2007

(54) HIGH-EFFICIENCY POLYMER ELECTROLUMINESCENT DEVICE WITH A POLYMER INSULATING NANOLAYER

(75) Inventors: Young Chul Kim, Seoul (KR); Jai Kyeong Kim, Seoul (KR); Jae-Woong Yu, Seoul (KR); O Ok Park, Daejeon (KR); Jong Hyeok Park, Ulsan (KR)

(73) Assignee: Korea Institute of Science and Technology, Seoul (KR)

( * ) Notice: Subject to any disclaimer, the term of this patent is extended or adjusted under 35 U.S.C. 154(b) by 104 days.

(21) Appl. No.: 11/025,384

(22) Filed: Dec. 29, 2004

(65) Prior Publication Data
US 2005/0194897 A1    Sep. 8, 2005

(30) Foreign Application Priority Data
Mar. 4, 2004    (KR) ............. 10-2004-0014517

(51) Int. Cl.
*H01J 1/62* (2006.01)
*H01J 63/04* (2006.01)
*H01L 27/15* (2006.01)

(52) U.S. Cl. ............. 313/509; 313/504; 313/506; 428/690; 257/79; 257/80

(58) Field of Classification Search ............. 313/504, 313/506, 509; 247/79, 80; 428/690
See application file for complete search history.

(56) References Cited

U.S. PATENT DOCUMENTS

| 4,617,195 | A | * | 10/1986 | Mental .................... 313/498 |
| 5,055,360 | A | * | 10/1991 | Ogura et al. ............. 313/509 |
| 5,756,147 | A | * | 5/1998 | Wu et al. ................. 427/66 |
| 6,312,836 | B1 | * | 11/2001 | Bulovic et al. ........... 313/504 |
| 6,428,914 | B2 | * | 8/2002 | Nagano et al. ........... 313/509 |
| 7,025,647 | B2 | * | 4/2006 | Miyazawa ............. 257/E51.029 |
| 2002/0030440 | A1 | * | 3/2002 | Yamazaki ................ 313/503 |
| 2003/0127967 | A1 | * | 7/2003 | Tsutsui et al. ............ 313/498 |
| 2003/0127974 | A1 | * | 7/2003 | Miyazawa ............... 313/504 |
| 2006/0091797 | A1 | * | 5/2006 | Tsutsui et al. ............ 313/506 |

FOREIGN PATENT DOCUMENTS

JP    08288069 A  * 11/1996
JP    2002-056976    2/2002

OTHER PUBLICATIONS

Computer translation of Fujii (item N above).*
Kim, Young-Eun et al., "Enhanced quantum efficiency in polymer electroluminescence devices by inserting a tunneling barrier formed by Langmuir-Blodgett films," (Jul. 29, 1996), pp. 599-601, Applied Physics Letters, vol. 69, No. 5, American Institute of Physics.

* cited by examiner

Primary Examiner—Nimeshkumar D. Patel
Assistant Examiner—Peter Macchiarolo
(74) Attorney, Agent, or Firm—Jones Day

(57) ABSTRACT

There is provided a polymer electroluminescent device, which comprises a transparent substrate, an anode, a polymer emitting layer, a polymer insulating nanolayer and a cathode. The polymer insulating nanolayer having the dielectric constant ($\in$) of less than 3.0 is located between the cathode and the polymer emitting layer. According to the present invention, it is possible to obtain the polymer electroluminescent device showing more improved luminance efficiency.

6 Claims, 4 Drawing Sheets

HIGH-EFFICIENCY POLYMER ELECTROLUMINESCENT DEVICE WITH A POLYMER INSULATING NANOLAYER

FIELD OF THE INVENTION

The present invention relates to a polymer electroluminescent device comprising a polymer insulating nanolayer having a dielectric constant (∈) of less than 3.0. Specifically, the present invention is directed to a polymer electroluminescent device comprising a polymer insulating nanolayer having a dielectric constant (∈) of less than 3.0 between a cathode and a polymer emitting layer.

BACKGROUND OF THE INVENTION

An electroluminescent device utilizes the electroluminescence (EL) phenomenon, wherein an electron injected from a cathode and a hole injected from an anode form an exciton in the polymer emitting layer. A light of a particular wavelength is emitted from the formed exciton. The electroluminescent device does not need back light and has many advantageous features (e.g., light weight, thin thickness, self-illumination, low driving voltage, fast switching speed, etc.) so that it can be widely utilized as a new display device.

As reported by R. H. Friend in 1990, the polymer electroluminescent device in which the thin film is formed by spin coating is fabricated by a more simple process when compared to the low molecular organic electroluminescent device in which the thin film is formed by thermal vapor deposition. Furthermore, the device has a high thermal stability and an excellent mechanical strength. Therefore, many institutes have studied and investigated the polymer electroluminescent device, especially in order to improve the luminance efficiency thereof.

The studies for improving the luminance efficiency are primarily focused on a hole injecting layer or an electron injecting layer. For example, one investigation discloses that the hole injecting layer or the electron injecting layer is filled with an ionomer to improve the luminance efficiency (Lee H. M. et al., Appl. Phys. Lett., 72, 2382, 1998). However, the ionomer limits the free movement of the ion, whereby the injection of the electron or the hole becomes restricted and the durability thereof may become significantly deteriorated if the ion of the ionomer is diffused into the polymer emitting layer.

Moreover, it was described that lithium fluoride (LiF), which could effectively inject the electron, was used in the electron injecting layer to increase the luminance efficiency (T. M. Brown et al., Applied Physics Letters, 77(19), pp. 3096–3098, 2000). The material, however, requires a vacuum deposition so that it is not possible to apply the material for fabricating a large area of device.

In addition, U.S. Pat. Nos. 5,537,000, 5,817,431 and 5,994,835 suggested the methods of using an inorganic nanoparticle, 2-(4-biphenylyl)-5-(4-tert-butylphenyl)-1,3,4-oxadiazole (PBD), chelate metal complex and the like for injecting the electron more effectively. However, it is difficult to fabricate a large area of the device by such method due to the vacuum deposition process.

Therefore, there is a need in the art for a polymer electroluminescent device, which has the improved luminance efficiency and which can be prepared in an easy and convenient manner.

SUMMARY OF THE INVENTION

The inventors discovered that it is possible to obtain the polymer electroluminescent (EL) device, which has a high luminance efficiency, by locating the polymer insulating nanolayer having a dielectric constant (∈) of less than 3.0 between a cathode and a polymer emitting layer. This results in an increase of the electron injection.

The object of the present invention is to provide such polymer electroluminescent device, which has the improved luminance efficiency and which can be prepared in an easy and convenient manner.

DETAILED DESCRIPTION OF THE PREFERRED EMBODIMENTS

The present invention provides a polymer electroluminescent device, which has the improved luminance efficiency and which can be easily prepared through the use of a convenient process.

The present invention is based on the discovery that it is possible to obtain the polymer electroluminescent (EL) device, which has a high luminance efficiency, by locating a polymer insulating nanolayer having a dielectric constant (∈) of less than 3.0 between a cathode and a polymer emitting layer. This increases the injection of the electron.

The following formula 1 was described in a literature (Kim Y. E et al., Applied Physics Letters, 69(5), pp. 599–601, 1996) and shows the voltage distributed in each layer when applying a voltage (V) to both electrodes. According to formula 1, it can be found that controlling the dielectric constant of the polymer insulating membrane can decrease the band bending of the polymer emitting layer.

$$V_1 = \frac{(\varepsilon_2/d_2)V - \sigma}{\varepsilon_1/d_1 + \varepsilon_2/d_2}, \quad V_2 = \frac{(\varepsilon_1/d_1)V - \sigma}{\varepsilon_1/d_1 + \varepsilon_2/d_2}, \quad V_1 + V_2 = V \quad \text{[Formula 1]}$$

In formula 1,

V is a voltage applied to both electrodes, $V_1$ is a voltage applied to the polymer emitting layer, $V_2$ is a voltage applied to the polymer insulating membrane, $\in_1$ is the dielectric constant of the polymer emitting layer, $\in_2$ is the dielectric constant of the polymer insulating membrane, $d_1$ is a thickness of the polymer emitting layer, $d_2$ is a thickness of the polymer insulating membrane, $\sigma_1$ is an accumulated charge of the polymer emitting layer, and $\sigma_2$ is an accumulated charge of the polymer insulating membrane.

Figure 1:
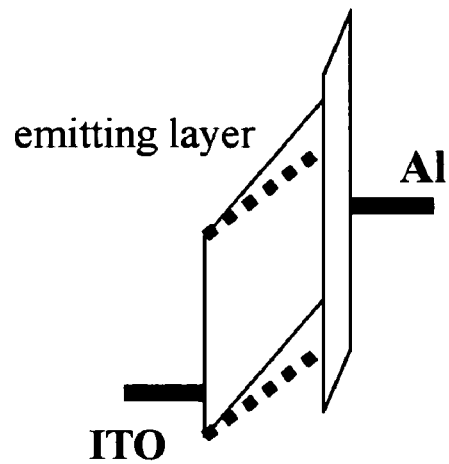
FIG. 1 depicts the polymer emitting layer band structure of the polymer electroluminescent device having the polymer insulating nanolayer.

If the band bending of the polymer emitting layer is decreased when the voltage is applied to both electrodes, the energy barrier that is necessary for injecting the electron becomes low. As such, the electron can be more easily injected from the electrode to the Lowest Unoccupied Molecular Orbital (LUMO) level of the polymer emitting layer (as shown in FIG. 1 illustrating the band structures of the polymer emitting layer and the polymer insulating nanolayer) when the polymer insulating nanolayer is present between the polymer emitting layer and the cathode. For this reason, if the polymer insulating nanolayer is located between the polymer emitting layer and the electrode, then the injections of the electron and the hole increase. Thus, it is possible to obtain the electroluminescent device of high efficiency.

Figure 5A:
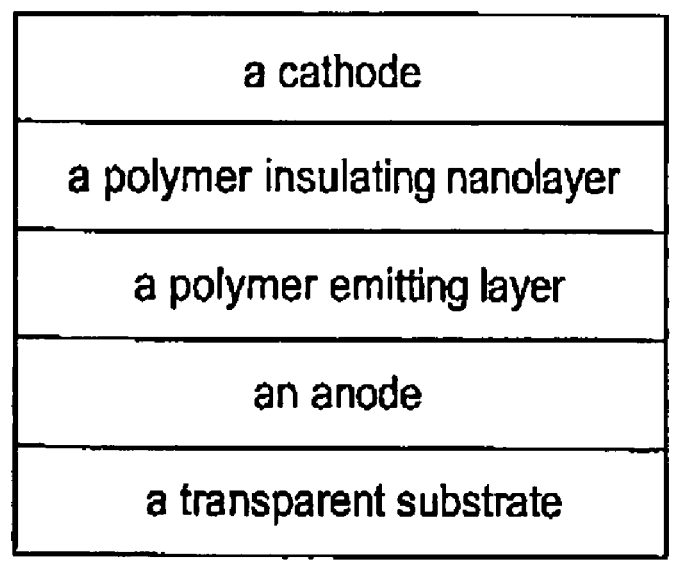
FIGS. 5(a) 5(d) illustrates different embodiments of the nolvmer electroluminescent device of the present invention.

The polymer elebtroluminescent device of the present invention comprises a transparent substrate, an anode, a polymer emitting layer, a polymer insulating nanolayer and a cathode as illustrated in FIG. 5(a). Said polymer insulating nanolayer has a dielectric constant ($\in$) of less than 3.0 and is located between the cathode and the polymer emitting layer.

Figure 5B:
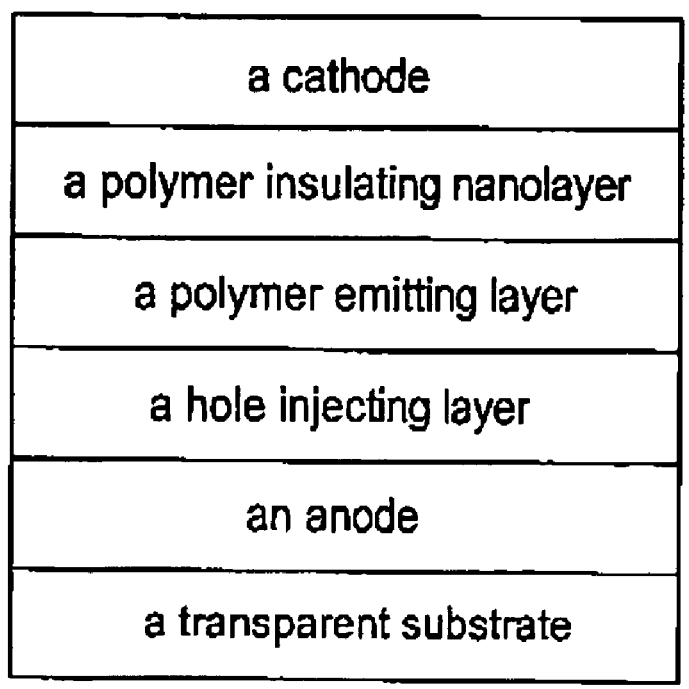
Figure 5C:
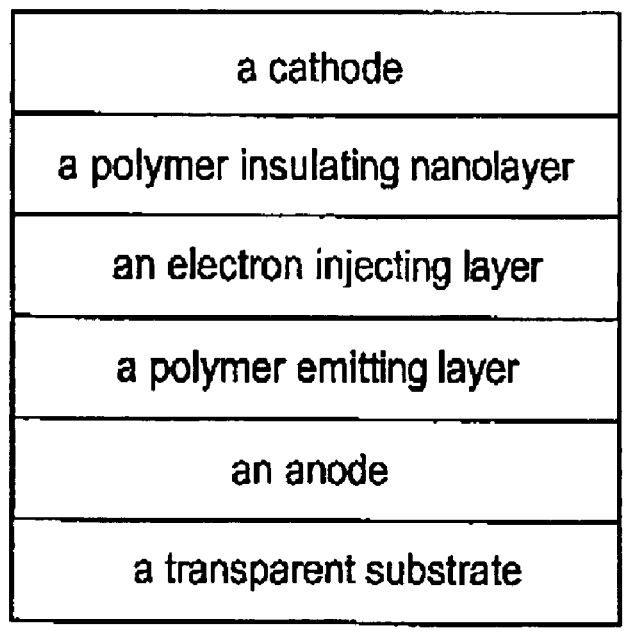
Figure 5D:
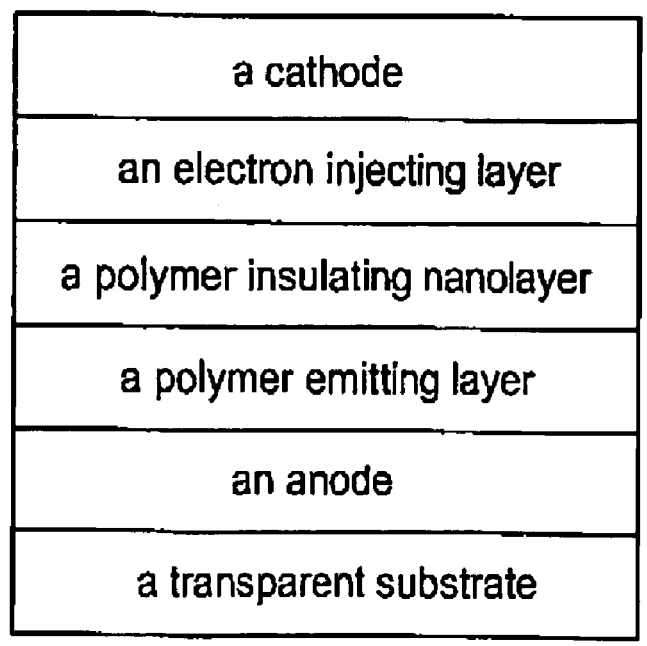

The polymer electroluminescent device can also comprise a hole injecting layer between the anode and the polymer emitting layer, as illustrated in FIG. 5(b). In other embodiments, the polymer electroluminescent device includes an electron injecting layer between the polymer emitting layer and the polymer insulating nanolayer (as illustrated in FIG. 5(c)) or between the polymer insulating nanolayer and the cathode (as illustrated in FIG. 5(d)).

Any material can be used as the polymer insulating nanolayer in the polymer electroluminescent device of the present invention as long as such material has the dielectric constant of less than 3.0. Also, the polymer used in the polymer insulating nanolayer of the present invention has to be preferably spin-coated so as to facilitate the process of forming the thin film. The examples of such polymer include, but are not limited to, polystyrene (PS, dielectric constant 2.5), polyethylene (PE, dielectric constant 2.6), polypropylene (PP, dielectric constant 2.3) and the like. If the polymer having the dielectric constant of less than 3.0 is used as the polymer insulating nanolayer of the present invention, it can significantly improve the current density and quantum efficiency.

Further, the thickness of the polymer insulating nanolayer in the polymer electroluminescent device has to be from 0.1 to 30 nm, and preferably from 1 to 15 nm, for the electron to pass therethrough. With respect to the thickness of the polymer insulating nanolayer, the electron has to pass through the insulating nanolayer tunneling. However, if the thickness is more than 30 nm, the electron has difficulty in passing through the insulating nanolayer. In case of the thickness of less than 0.1 nm, the pin hole and the like may be caused to be formed.

Any transparent substrate, which is conventionally used in the electroluminescent device, can be used as the transparent substrate of the polymer electroluminescent device of the present invention. The exemplary transparent substrates used in the polymer electroluminescent device include, but are not limited to, glass, quartz, polyethylene terephthalate (PET), polycarbonate (PC), polyethersulfone (PES) plate and the like.

The complex metal oxide thin film, such as Indium-Tin Oxide (ITO), is preferably used as the anode of the polymer electroluminescent device. This is because the film is transparent to the visible light.

The polymer emitting layer used in the polymer electroluminescent device can comprise a light emitting type of conjugated polymer such as poly(para-phenylenevinylene) based derivative, polythiophene based derivative, poly(para-phenylene) based derivative or polyfluorene based derivative. Alternatively, it can comprise a light emitting type of non-conjugated polymer, wherein the branched chain is substituted by a light emitting functional group such as anthracene.

The material for the hole injecting layer, which can be used in the present invention, is preferably a compound having the following characteristics: a hole transporting capability; an effect of injecting the hole from the anode; a superior hole injection effect for the polymer emitting layer or the light emitting material; and an excellent thin film forming capability. More specifically, the exemplary materials for the hole injecting layer include, but are not limited to, phthalocyanine derivative, naphthalocyanine derivative, porpyrine derivative, oxazole, oxadiazole, triazole, imidazole, imidazolone, imidazolethione, pyrazoline, pyrazolone, tetrahydroimidazole, hydrazone, acylhydrazone, polyarylalkane, stylbene, butadiene, benzidine type triphenylamine, styrylamine type triphenylamine, diamine type triphenylamine and their derivative, polyvinylcarbazole, polysilane and conductive polymer.

The materials, which can be used as the cathode of the polymer electroluminescent device according to the present invention, preferably include, but are not limited to, a metal having a low work function, such as Cs, Li and Ca, and a stable metal having a high work function, such as Al, Cu, Ag, and Mg, and the alloy thereof.

The luminance efficiency of the electroluminescent device is primarily expressed as a quantum efficiency (% photons/electrons), which indicates the emitted photons per the injected electron as percentage. The polymer electroluminescent device of the present invention shows about 0.7% of the external quantum efficiency and about 1.75V of turn-on voltage. This indicates that the electroluminescent device of the present invention provides superior performance to the polymer electroluminescent device using polymethyl methacrylate having the dielectric constant of 3.0 showing about 0.015% of the external quantum efficiency and about 2.1V of turn-on voltage as the insulating nanolayer.

The polymer electroluminescent device comprising the polymer insulating nanolayer according to the present invention can be fabricated by using the following conventional method known to one skilled in the art.

First, ITO is deposited on a transparent substrate and then a light emitting polymer is spin coated thereon to form a polymer emitting layer. A polymer insulating nanolayer is spin coated on the polymer emitting layer thus formed. Then, a metal is deposited thereon by a thermal deposition to form a metal electrode, that is cathode, thereby forming a polymer insulating nanolayer of the present invention.

Thus, the polymer insulating nanolayer can be applied to the polymer electroluminescent device simply by the spin coating.

The present invention will now be described in detail with reference to the following examples, which are not intended to limit the scope of the invention.

EXAMPLES

Example 1

Poly(2-methoxy-5-(2'-ethyl-hexyloxy)-1,4-phenylenevinylene) (MEHPPV, molecular weight 1,000,000, H. W. Sands, U.S.A.) was spin coated on ITO-deposited glass substrate by using chlorobenzene (HPLC grade, Aldrich) as a solvent to the thickness of 120 nm and then heat treated for 2 hours to completely remove the solvent. Thereafter, the MEHPPV membrane was again spin coated as a polymer insulating nanolayer to the thickness of 10 nm the polystyrene (PS, dielectric constant 2.5, molecular weight 280,000, Aldrich), polyethylene (PE, dielectric constant 2.6, molecular weight 125,000, Aldrich), polymethyl methacrylate (PMMA, dielectric constant 3.0, molecular weight 120,000, Aldrich) and polyethylene oxide (PEO, dielectric constant 4.0, molecular weight 30,000, Aldrich), respectively. Aluminum electrode was deposited on the respective spin coated membrane under high vacuum of $5 \times 10^{-5}$ torr to fabricate the electroluminescent device having ITO/MEHPPV/polymer insulating nanolayer/Al structure.

Example 2

Determination of voltage-current-emission intensity properties of each electroluminescent device prepared by Example 1

Voltage-current-emission intensity properties of each polymer electroluminescent device prepared by Example 1 were determined by using an apparatus comprising an optical powermeter (Newport 1830-C), a photo diode (Newport 818-UV) and a source-measurement unit (Keithley 236). The quantum efficiency was calculated from the determined results and shown in FIGS. 2 to 4.

Figure 2:
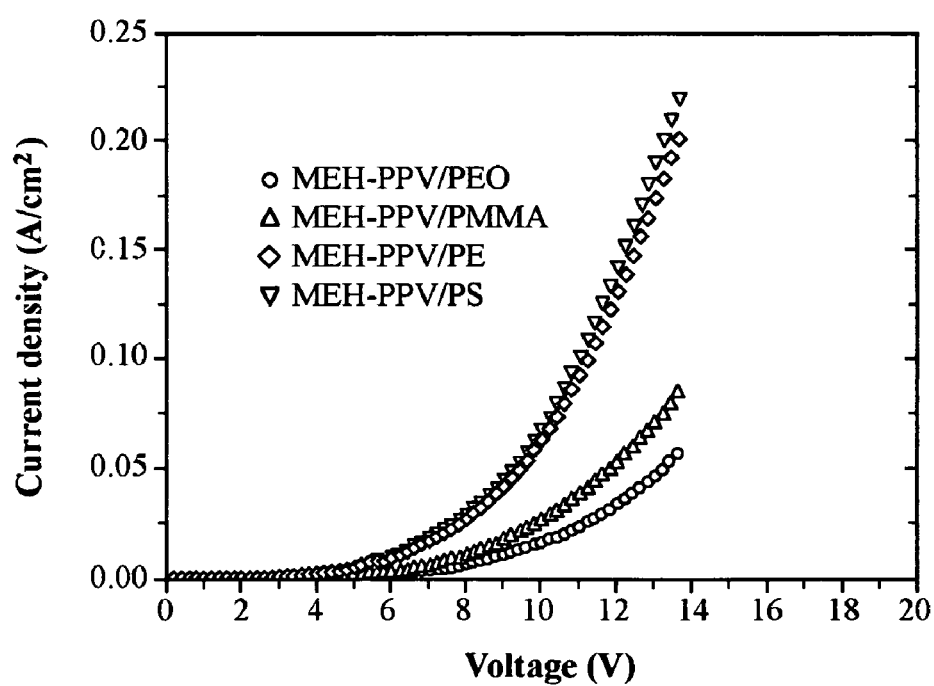
FIG. 2 is a graph showing the current density vs. the voltage of each polymer electroluminescent device prepared by Example 1.

FIG. 2 is a graph showing the current behavior vs. the voltage of each polymer electroluminescent device prepared by Example 1. As depicted in FIG. 2, the electroluminescent device, wherein polystyrene or polyethylene having the dielectric constant of less than 3.0 is spin coated as the polymer insulating nanolayer, shows superior current behavior to the device in which the polymer having the dielectric constant of 3.0 or more is spin coated as the polymer insulating nanolayer.

The increased current means the increase of the charge movement in the cathode, which indicates in turn that the electron injection has increased. Since the main charge carrier is the hole in case of the electroluminescent device using Al cathode in Example 1, the increase of the electron injection means that the device can show high external quantum efficiency.

Figure 3:
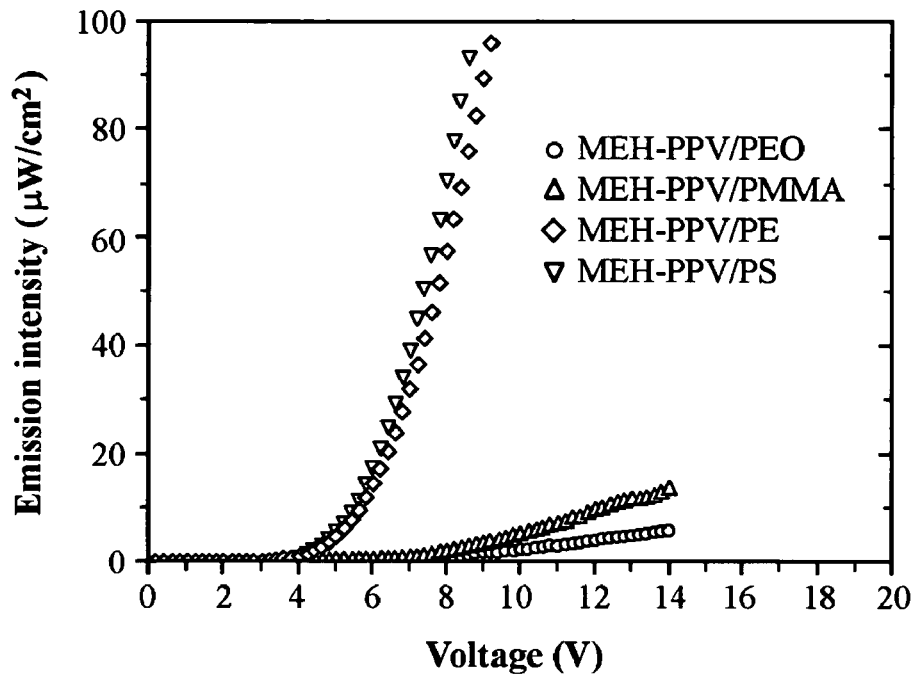
FIG. 3 is a graph showing the emission intensity vs. the voltage of each polymer electroluminescent device prepared by Example 1.

FIG. 3 is a graph showing the emission intensity vs. the voltage of each polymer electroluminescent device prepared by Example 1. As depicted in FIG. 3, it can be noted that the increased electron injection in turn improves the emission intensity.

Figure 4:
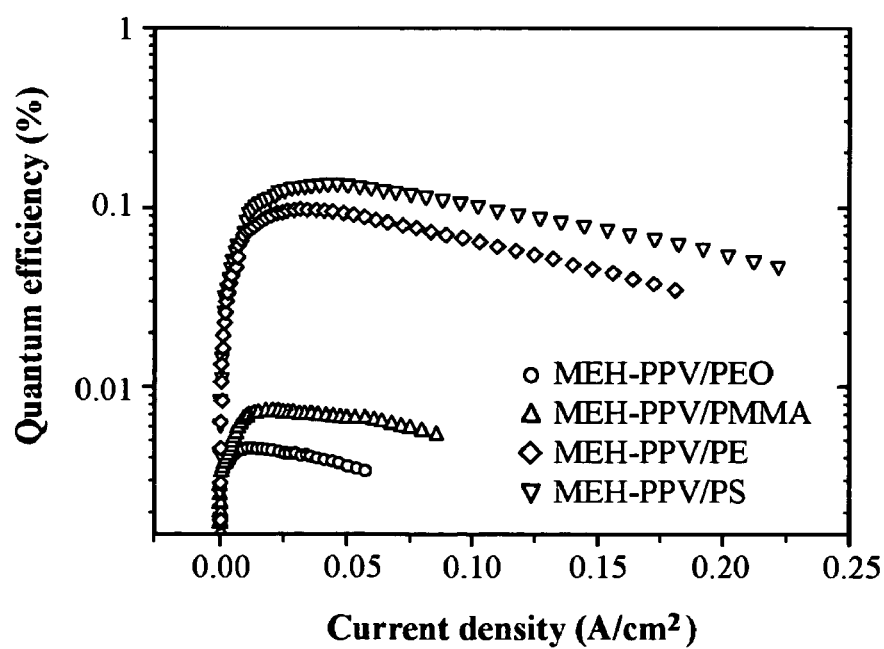
FIG. 4 is a graph showing the quantirn efficiency vs. the current density of each poiymer electroluminescent device prepared by Example 1.

FIG. 4 is a graph showing the external quantum efficiency of each polymer electroluminescent device prepared by Example 1. The electroluminescent device, wherein polystyrene or polyethylene having the dielectric constant of less than 3.0 is spin coated as the polymer insulating nanolayer, shows an external quantum efficiency of 10 times more than the device in which the polymer having the dielectric constant of 3.0 or more is spin coated as the polymer insulating nanolayer.

If the polymer insulating nanolayer having the dielectric constant of less than 3.0 is located between the cathode and the polymer emitting layer in the polymer electroluminescent device, it is possible to obtain the polymer electroluminescent device showing more improved luminance efficiency. Furthermore, the polymer insulating nanolayer can be applied to the polymer electroluminescent device simply by the spin coating so that the process for preparation thereof is simple and convenient.

What is claimed is:

1. A polymer electroluminescent device comprising:
   a transparent substrate, an anode, a polymer emitting layer, a cathode, and a polymer insulating nanolayer, for decreasing the band bending of the polymer emitting layer and lowering the energy barrier for electron injection to the emitting layer,
   wherein said polymer insulating nanolayer has a dielectric constant of less than 3.0 and is located between the cathode and the polymer emitting layer.

2. The polymer electroluminescent device according to claim 1, further comprising a hole injecting layer between the anode and the polymer emitting layer.

3. The polymer electroluminescent device according to claim 1, further comprising an electron injecting layer between the polymer emitting layer and the polymer insulating nanolayer.

4. The polymer electroluminescent device according to claim 1, further comprising an electron injecting layer between the polymer insulating nanolayer and the cathode.

5. The polymer electroluminescent device according to claim 1, wherein the polymer insulating nanolayer comprises a polymer selected from a group consisting of polystyrene, polyethylene and polypropylene.

6. The polymer electroluminescent device according to claim 1, wherein a thickness of the polymer insulating nanolayer is between about 0.1 nm and about 30 nm.

* * * * *